United States Patent
Yamaguchi

(10) Patent No.: US 12,231,159 B2
(45) Date of Patent: Feb. 18, 2025

(54) RADIO-FREQUENCY MODULE AND COMMUNICATION APPARATUS

(71) Applicant: Murata Manufacturing Co., Ltd., Nagaokakyo (JP)

(72) Inventor: Yukiya Yamaguchi, Nagaokakyo (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 721 days.

(21) Appl. No.: 17/465,846

(22) Filed: Sep. 3, 2021

(65) Prior Publication Data

US 2021/0399758 A1 Dec. 23, 2021

Related U.S. Application Data

(63) Continuation of application No. PCT/JP2020/007094, filed on Feb. 21, 2020.

(30) Foreign Application Priority Data

Mar. 7, 2019 (JP) .................................. 2019-041699

(51) Int. Cl.
*H04B 1/40* (2015.01)
*H03F 3/24* (2006.01)
(Continued)

(52) U.S. Cl.
CPC ............... *H04B 1/40* (2013.01); *H03F 3/245* (2013.01); *H03F 2200/171* (2013.01);
(Continued)

(58) Field of Classification Search
None
See application file for complete search history.

(56) References Cited

U.S. PATENT DOCUMENTS

| | | | |
|---|---|---|---|
| 6,380,823 B1 * | 4/2002 | Ikata | H04B 1/52 333/133 |
| 2004/0067771 A1 * | 4/2004 | Wieck | H04B 1/3838 455/557 |

(Continued)

FOREIGN PATENT DOCUMENTS

| | | | |
|---|---|---|---|
| CN | 1652333 A * | 8/2005 | ............... H04B 1/38 |
| JP | 9-51015 A | 2/1997 | |

(Continued)

OTHER PUBLICATIONS

International Search Report and Written Opinion mailed on May 26, 2020, received for PCT Application PCT/JP2020/007094, Filed on Feb. 21, 2020, 9 pages including English Translation.

(Continued)

*Primary Examiner* — Pablo N Tran
(74) *Attorney, Agent, or Firm* — XSENSUS LLP

(57) ABSTRACT

A radio-frequency module includes a mounting substrate including a ground electrode layer formed by a planar wiring pattern; multiple ground terminals, which are multiple external connection terminals that are arranged on a first main surface of the mounting substrate and that are set to ground potential; and a first radio-frequency component (for example, a reception filter and/or a low noise amplifier) mounted on the first main surface. The multiple ground terminals are arranged at an outer periphery side of the first main surface with respect to the first radio-frequency component and are connected to the ground electrode layer. In a plan view of the mounting substrate, at least part of the first radio-frequency component is overlapped with the ground electrode layer.

17 Claims, 9 Drawing Sheets

(51) Int. Cl.
  *H03H 9/64* (2006.01)
  *H03H 9/72* (2006.01)
  *H04B 1/38* (2015.01)
  *H04M 1/00* (2006.01)

(52) U.S. Cl.
  CPC .. *H03F 2200/222* (2013.01); *H03F 2200/294* (2013.01); *H03F 2200/451* (2013.01)

(56) References Cited

U.S. PATENT DOCUMENTS

2017/0338847 A1 11/2017 Reisner et al.
2018/0076148 A1 3/2018 Nguyen et al.

FOREIGN PATENT DOCUMENTS

| JP | 2004-71961 A | 3/2004 | |
|---|---|---|---|
| JP | 2010-219180 A | 9/2010 | |
| JP | 2011-40602 A | 2/2011 | |
| JP | 2013-59220 A | 3/2013 | |
| JP | 2014-007227 A | 1/2014 | |
| WO | WO-2013035655 A1 * | 3/2013 | ........... H01L 21/561 |
| WO | 2018/168653 A1 | 9/2018 | |

OTHER PUBLICATIONS

Written Opinion of the International Searching Authority mailed on May 26, 2020, received for PCT Application PCT/JP2020/007094, Filed on Feb. 21, 2020, 7 pages. (Previously filed; submitting English translation only.).

* cited by examiner

RADIO-FREQUENCY MODULE AND COMMUNICATION APPARATUS

CROSS-REFERENCE TO RELATED APPLICATIONS

This application is a Continuation Application of PCT Application No. PCT/JP2020/007094, filed Feb. 21, 2020 and based upon and claiming the benefit of priority from Japanese Patent Application No. 2019-041699, filed Mar. 7, 2019, the entire contents of all of which are incorporated herein by reference.

BACKGROUND

1. Field of the Disclosure

The present disclosure relates to a radio-frequency module and a communication apparatus including the radio-frequency module.

2. Description of the Related Art

In mobile communication devices, such as mobile phones, the numbers of circuit elements composing radio-frequency front-end circuits are increased particularly with the progress of multiband communication to make it difficult to reduce the sizes of radio-frequency modules.

Japanese Unexamined Patent Application Publication No. 2011-040602 discloses a semiconductor module realizing a reduction in size using a substrate of a dual side mounting type.

However, in the radio-frequency modules in the related art, the effect of shielding radio-frequency components mounted on the substrates may be insufficient.

SUMMARY

In view of the problem outlined above, an object of the present disclosure is to provide a radio-frequency module and so on, which are capable of improving the effect of shielding radio-frequency components mounted on a substrate.

In order to achieve the above object, a radio-frequency module according to an embodiment of the present disclosure includes a mounting substrate including a ground electrode layer formed by a planar wiring pattern; multiple external connection terminals that are arranged on a first main surface of the mounting substrate and that is set to ground potential; and a first radio-frequency component mounted on the first main surface. The multiple external connection terminals are arranged at an outer periphery side of the first main surface with respect to the first radio-frequency component and are connected to the ground electrode layer. In a plan view of the mounting substrate, at least part of the first radio-frequency component is overlapped with the ground electrode layer.

According to the present disclosure, it is possible to improve the shielding effect of the radio-frequency component mounted on the substrate.

Other features, elements, characteristics and advantages of the present disclosure will become more apparent from the following detailed description of preferred embodiments of the present disclosure with reference to the attached drawings.

DETAILED DESCRIPTION

Figure 1:
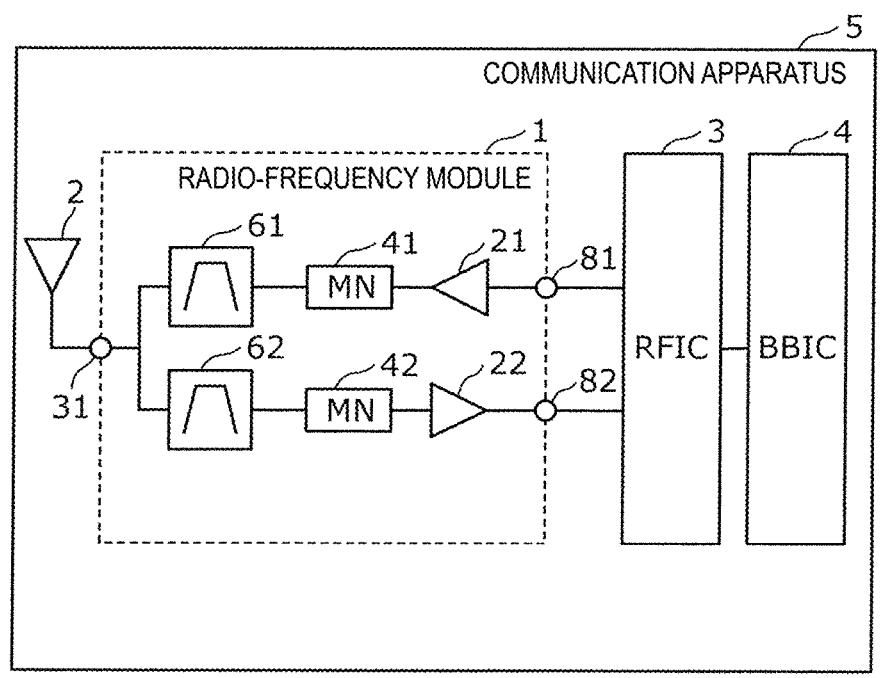
FIG. 1 is a diagram illustrating the circuit configuration of a radio-frequency module and a communication apparatus according to an embodiment.

Embodiments and modifications of the embodiments of the present disclosure will herein be described in detail with reference to the drawings. All the embodiments and the modifications described below indicate comprehensive or specific examples. Numerical values, shapes, materials, components, the arrangement of the components, the connection mode of the components, and so on, which are indicated in the embodiments and the modifications described below, are only examples and are not intended to limit the present disclosure. Among the components in the embodiments and the modifications described below, the components that are not described in the independent claims are described as optional components.

The respective drawings are schematic diagrams subjected to arbitrary emphasis, omission, or adjustment of the ratios to indicate the present disclosure and are not necessarily strictly illustrated. The shapes, the positional relationship, and the ratios in the respective drawings may be different from the actual shapes, positional relationship, and ratios. The same reference numerals are added to substantially the same components in the respective drawings and a duplicated description of such components may be omitted or simplified herein.

In the respective drawings described below, the X axis and the Y axis are axes that are orthogonal to each other on a plane parallel to the main surface of a mounting substrate. The Z axis is an axis vertical to the main surface of a module substrate. The positive direction of the Z axis indicates the up direction and the negative direction thereof indicates the down direction.

In the present disclosure, "connected" includes not only direct connection with a connection terminal and/or a wiring conductor but also electrical connection via another circuit element.

In the present disclosure, terms, such as parallel and vertical, indicating the relationship between elements; terms, such as rectangles, indicating the shapes of the elements; and numerical ranges do not represent only strict meanings but mean inclusion of substantially the same ranges, for example, differences on the order of few percent.

In the present disclosure, a "plan view" means viewing an object projected on the X-Y plane from the Z direction.

Embodiment

An embodiment will now be described with reference to FIG. 1 to FIG. 5.

[1.1 Circuit Configuration of Radio-Frequency Module 1 and Communication Apparatus 5]

The circuit configuration of a radio-frequency module 1 and a communication apparatus 5 according to the present embodiment will be specifically described with reference to FIG. 1.

FIG. 1 is a diagram illustrating the circuit configuration of the radio-frequency module 1 and the communication apparatus 5 according to the embodiment. Referring to FIG. 1, the communication apparatus 5 includes the radio-frequency module 1, an antenna element 2, a radio-frequency (RF) signal processing circuit (radio-frequency integrated circuit (RFIC)) 3, and a baseband signal processing circuit (baseband integrated circuit (BBIC)) 4.

The radio-frequency module 1 transmits a radio-frequency signal between the antenna element 2 and the RFIC 3. The radio-frequency module 1 is an integrated module in which various functional components used in a radio-frequency front-end circuit conforming to, for example, Long Term Evolution (LTE), Wi-Fi (registered trademark), Bluetooth (registered trademark), or Global Positioning System (GPS) are integrated. The radio-frequency module according to the embodiment of the present disclosure is not limited to this.

The antenna element 2 is connected to a common terminal 31 of the radio-frequency module 1. The radio-frequency signal transmitted from the outside of the radio-frequency module 1 is received through the antenna element 2 and is supplied to the radio-frequency module 1.

The RFIC 3 is an RF signal processing circuit that processes the radio-frequency signals transmitted and received through the antenna element 2. For example, the RFIC 3 performs signal processing, such as down-conversion, to a radio-frequency reception signal input and transmitted through a reception output terminal 82 of the radio-frequency module 1 and supplies a reception signal resulting from the signal processing to the BBIC 4.

The BBIC 4 is a circuit that performs signal processing using an intermediate frequency lower than the frequency of the radio-frequency signal propagated through the radio-frequency module 1. The signal processed in the BBIC 4 is used as, for example, an image signal for image display and/or an audio signal for talking with a speaker.

The antenna element 2 and the BBIC 4 are not essential components for the communication apparatus according to the embodiment of the present disclosure.

A detailed configuration of the radio-frequency module 1 will now be described. In the present embodiment, the radio-frequency module 1 composes a transmission-reception circuit of the radio-frequency signal.

Referring to FIG. 1, the radio-frequency module 1 includes the common terminal 31, a transmission input terminal 81, the reception output terminal 82, a power amplifier 21, a low noise amplifier 22, a transmission filter 61, a reception filter 62, and matching circuits 41 and 42.

The common terminal 31 is connected to the antenna element 2.

The power amplifier 21 is an example of a second radio-frequency component and amplifies a radio-frequency transmission signal input through the transmission input terminal 81.

The low noise amplifier 22 is an example of a first radio-frequency component and amplifies the radio-frequency reception signal supplied from the antenna element 2 through the reception filter 62 with low noise.

The transmission filter 61 is an example of the second radio-frequency component and is a filter element using a transmission band of a certain band (frequency band) as a passband.

The reception filter 62 is an example of the first radio-frequency component and is a filter element using a reception band of a certain band (frequency band) as the passband.

When the band of the transmission filter 61 is the same as that of the reception filter 62, the transmission filter 61 and the reception filter 62 may compose a duplexer for the band. Each of the transmission filter 61 and the reception filter 62 may be any of a surface acoustic wave filter, an acoustic wave filter using bulk acoustic waves (BAWs), a piezoelectric film bulk acoustic resonator (FBAR) filter, an LC resonant filter, and a dielectric filter and is not limited to these filters.

The matching circuit 41 is connected to a path connecting the power amplifier 21 to the transmission filter 61. The matching circuit 41 performs impedance matching between the power amplifier 21 and the transmission filter 61. Specifically, the matching circuit 41 is a circuit for matching the output impedance of the power amplifier 21 with the input impedance of the transmission filter 61. The matching circuit 41 includes passive elements, such as an inductor and a capacitor, as an example of a second matching element.

The matching circuit 42 is connected to a path connecting the low noise amplifier 22 to the reception filter 62. The matching circuit 42 performs impedance matching between the low noise amplifier 22 and the reception filter 62. Specifically, the matching circuit 42 is a circuit for matching the output impedance of the reception filter 62 with the input impedance of the low noise amplifier 22. The matching circuit 42 includes passive elements, such as an inductor and a capacitor, as an example of a first matching element.

[1.2 Arrangement Configuration of Circuit Elements in Radio-Frequency Module 1]

The arrangement configuration of circuit elements composing the radio-frequency module 1 will now be specifically described with reference to FIG. 2 to FIG. 4.

Figure 2:
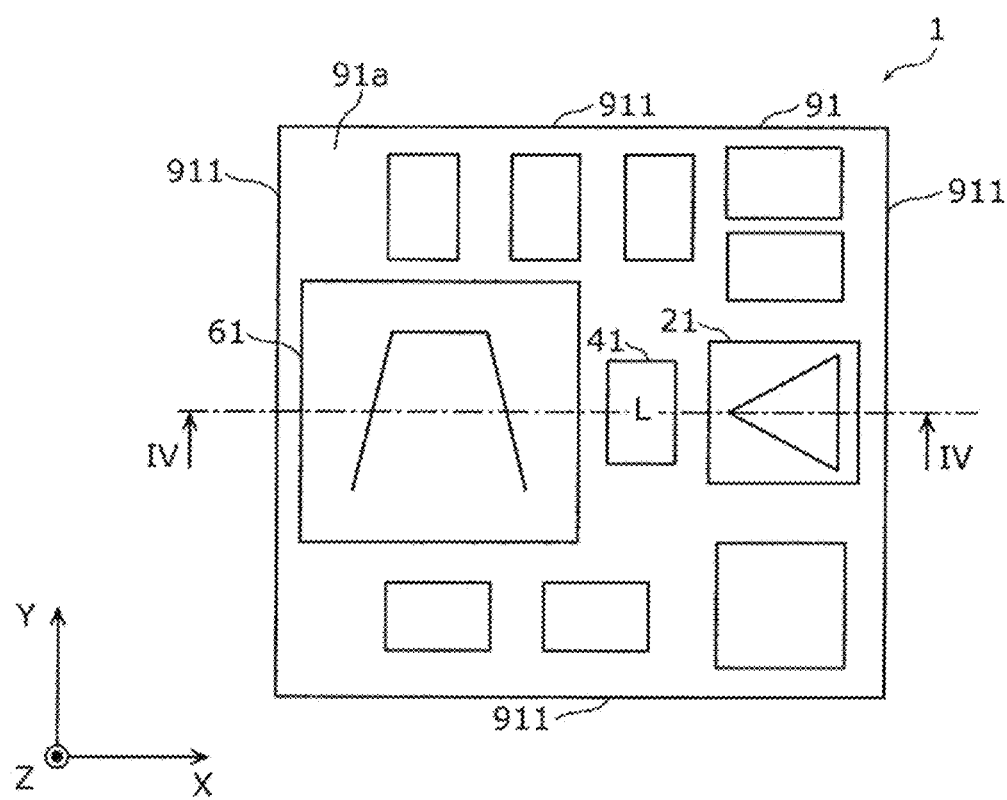
FIG. 2 is a plan view of the radio-frequency module according to the embodiment.

FIG. 2 is a plan view of the radio-frequency module 1 according to the embodiment. FIG. 3 is a bottom view of the radio-frequency module 1 according to the embodiment. FIG. 4 is a cross-sectional view of the radio-frequency module 1 according to the embodiment. FIG. 4 is a cross-sectional view taken along the IV-IV line in FIG. 2 and FIG. 3.

Figure 3:
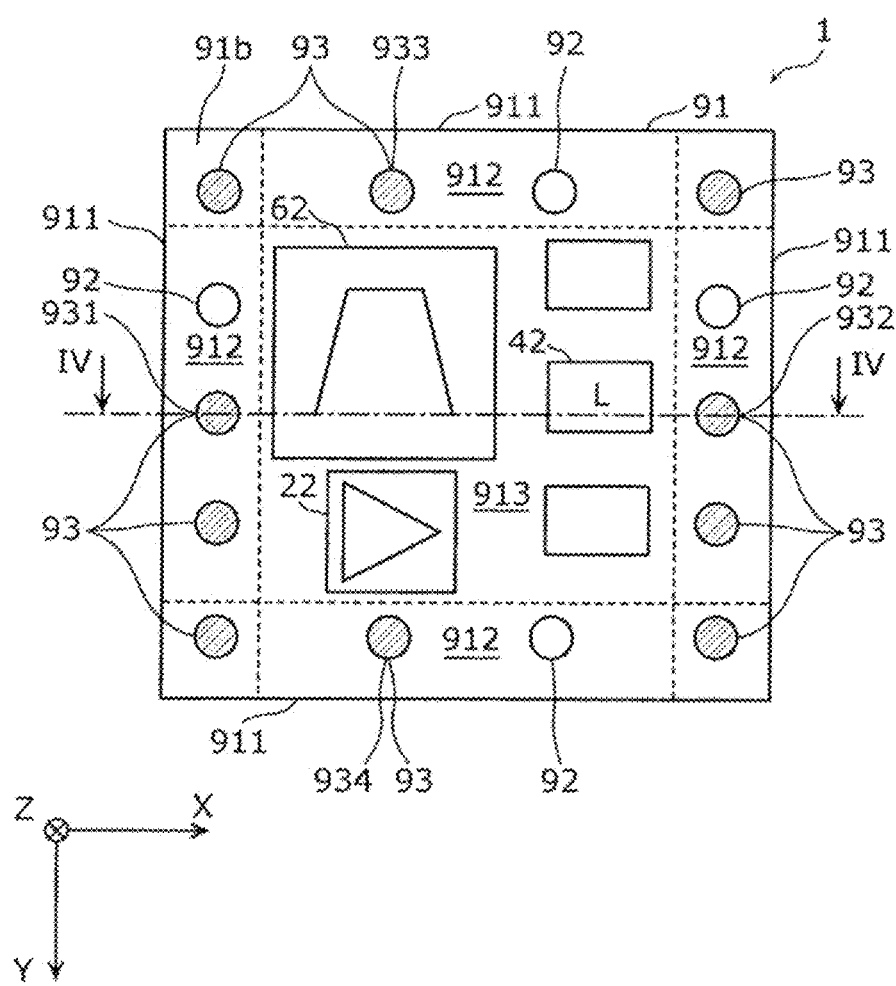
FIG. 3 is a bottom view of the radio-frequency module according to the embodiment.

Illustration of resin members 941 and 942 and a shielding electrode layer 95 is omitted in FIG. 2 and FIG. 3. Ground terminal 93 are hatched in FIG. 3 to discriminate between input-output terminals 92 and the ground terminals 93. Illustration of planar wiring patterns in a mounting substrate 91, excluding a ground electrode layer 915, is omitted in FIG. 4.

Figure 4:
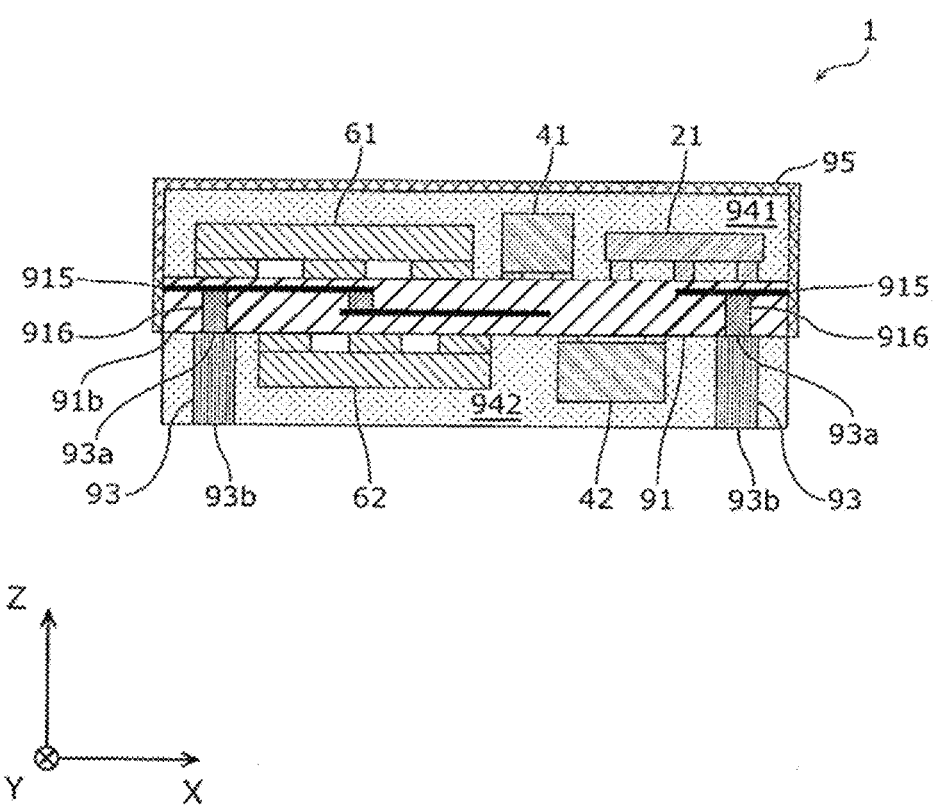
FIG. 4 is a cross-sectional view of the radio-frequency module according to the embodiment.

Referring to FIG. 2 to FIG. 4, the radio-frequency module 1 includes the mounting substrate 91, the input-output terminals 92, the ground terminals 93, the resin members 941 and 942, the shielding electrode layer 95, and other circuit elements (with no reference numerals), in addition to the circuit elements illustrated in FIG. 1.

The mounting substrate 91 is, for example, a printed circuit board (PCB), a low temperature co-fired ceramic (LTCC) substrate, or a resin multilayer substrate. Although the mounting substrate 91 has a substantially rectangular shape in a plan view, as illustrated in FIG. 2 and FIG. 3, in the present embodiment, the shape of the mounting substrate 91 is not limited to this.

The mounting substrate 91 has main surfaces 91a and 91b that are opposed to each other. Here, the main surface 91a is an example of a second main surface and may be called a surface or a top face. The main surface 91b is an example of a first main surface and may be called a rear face or a bottom face. In the present embodiment, a transmission circuit is mounted on the main surface 91a and a reception circuit is mounted on the main surface 91b. Specifically, the transmission filter 61, the power amplifier 21, and the matching circuit 41 are mounted on the main surface 91a and the reception filter 62, the low noise amplifier 22, and the matching circuit 42 are mounted on the main surface 91b. The reception circuit may be mounted on the main surface 91a and the transmission circuit may be mounted on the main surface 91b.

The mounting substrate 91 includes the ground electrode layer 915, as illustrated in FIG. 4. The ground electrode layer 915 is formed by a planar wiring pattern. The planar arrangement of the ground electrode layer 915 will be described below with reference to FIG. 5. The ground electrode layer 915 may be formed of a single-layer planar wiring pattern or may be formed of a multilayer planar wiring pattern.

The resin member 941 is formed on the main surface 91a, and the transmission filter 61, the matching circuit 41, and the power amplifier 21 are covered with the resin member 941. The resin member 941 has a function to ensure the reliabilities, such as the mechanical strength and the moisture resistance, of the transmission filter 61, the matching circuit 41, and the power amplifier 21. The resin member 941 may not cover all the faces of the transmission filter 61, the matching circuit 41, and the power amplifier 21. For example, the resin member 941 may cover only the side faces of the power amplifier 21.

The resin member 942 is formed on the main surface 91b, and the reception filter 62, the matching circuit 42, and the low noise amplifier 22 are covered with the resin member 942. The resin member 942 has a function to ensure the reliabilities, such as the mechanical strength and the moisture resistance, of the reception filter 62, the matching circuit 42, and the low noise amplifier 22. The resin member 942 may not cover all the faces of the reception filter 62, the matching circuit 42, and the low noise amplifier 22. For example, the resin member 942 may cover only the side faces of the low noise amplifier 22.

Each of the input-output terminals 92 is a terminal for transmitting and receiving electrical signals to and from an external substrate (not illustrated). Each of the input-output terminals 92 is a substantially columnar copper electrode extending in the Z direction from the main surface 91b of the mounting substrate 91 and passes through the resin member 942 to connect the mounting substrate 91 to the external substrate. The external substrate is, for example, a mother board arranged at the negative direction side of the Z axis of the radio-frequency module 1.

The ground terminals 93 are arranged on the main surface 91b of the mounting substrate 91 and are an example of multiple external connection terminals set to ground potential. In the present embodiment, each of the ground terminals 93 is a substantially columnar copper electrode extending in the Z direction from the main surface 91b of the mounting substrate 91 and passes through the resin member 942 to connect the mounting substrate 91 to the external substrate. An end face 93b of each ground terminal 93 is exposed from the resin member 942 at the negative direction side of the Z axis to be connected to a ground terminal (not illustrated) of the external substrate.

The ground terminals 93 are connected to the ground electrode layer 915. Specifically, an end face 93a of each ground terminal 93 is connected to the ground electrode layer 915 via a via conductor 916. The end face 93a connected to the ground electrode layer 915 is opposed to the end face 93b connected to the external substrate. Although the ground terminals 93 are connected to the ground electrode layer 915 only via the via conductors 916 in FIG. 4, the connection mode of the ground terminals 93 is not limited to this. For example, the ground terminals 93 may be connected to the ground electrode layer 915 via both the planar wiring patterns and the via conductors.

As illustrated in FIG. 3, the input-output terminals 92 and the ground terminals 93 are arranged at the outer periphery side of the main surface 91b with respect to the reception filter 62 and the low noise amplifier 22. Specifically, the input-output terminals 92 and the ground terminals 93 are arranged in four marginal portions 912 along four sides 911 of the mounting substrate 91. The reception filter 62, the matching circuit 42, and the low noise amplifier 22 are arranged in a central portion 913 surrounded by the four marginal portions 912. Referring to FIG. 3, each of the four marginal portions 912 is a substantially rectangular long area extending in the X direction or the Y direction, which is surrounded by broken lines, on the main surface 91b. Among the four marginal portions 912, the two adjacent marginal portions 912 are overlapped with each other in each corner area of the mounting substrate 91.

In the present embodiment, three or four ground terminals 93 are arranged in each of the four marginal portions 912. The ground terminal 93 is arranged at a position opposed to each of the reception filter 62 and the low noise amplifier 22 in the direction perpendicular to the side of the corresponding marginal portion in each of the four marginal portions 912.

For example, a ground terminal 931 is arranged at a position opposed to the reception filter 62 in the X direction perpendicular to the side 911 of the marginal portion 912 where the ground terminal 931 is arranged. Similarly, a ground terminal 932 is arranged at a position opposed to the reception filter 62 in the X direction perpendicular to the side 911 of the marginal portion 912 where the ground terminal 932 is arranged. Each of the remaining two ground terminals 933 and 934 is arranged at a position opposed to the reception filter 62 in the Y direction perpendicular to the side 911 of the marginal portion 912 where the ground terminal 933 or 934 is arranged. At this time, the reception filter 62 is sandwiched between the two ground terminals 931 and 932 in the X direction and is sandwiched between the two ground terminals 933 and 934 in the Y direction.

The input-output terminals 92 and the ground terminals 93 may not necessarily have substantially columnar shapes and may not be made of copper. The shapes and the materials of the input-output terminals 92 and the ground terminals 93 are not restricted. For example, the input-output terminals 92 and the ground terminals 93 may be substantially hemispherical electrodes (bumps) and, for example, may be solder balls or copper core balls.

The shielding electrode layer 95 covers the surface of the resin member 941 and is connected to the ground electrode layer 915. For example, the shielding electrode layer 95 is connected to the shielding electrode layer 95 on the side faces of the mounting substrate 91.

The resin members 941 and 942 and the shielding electrode layer 95 are not essential components for the radio-frequency module 1 according to the embodiment of the present disclosure. The input-output terminals 92 may not be arranged on the main surface 91b and may be replaced with boding wire or the like.

[1.3 Planar Arrangement of Ground Electrode Layer 915]

Figure 5:
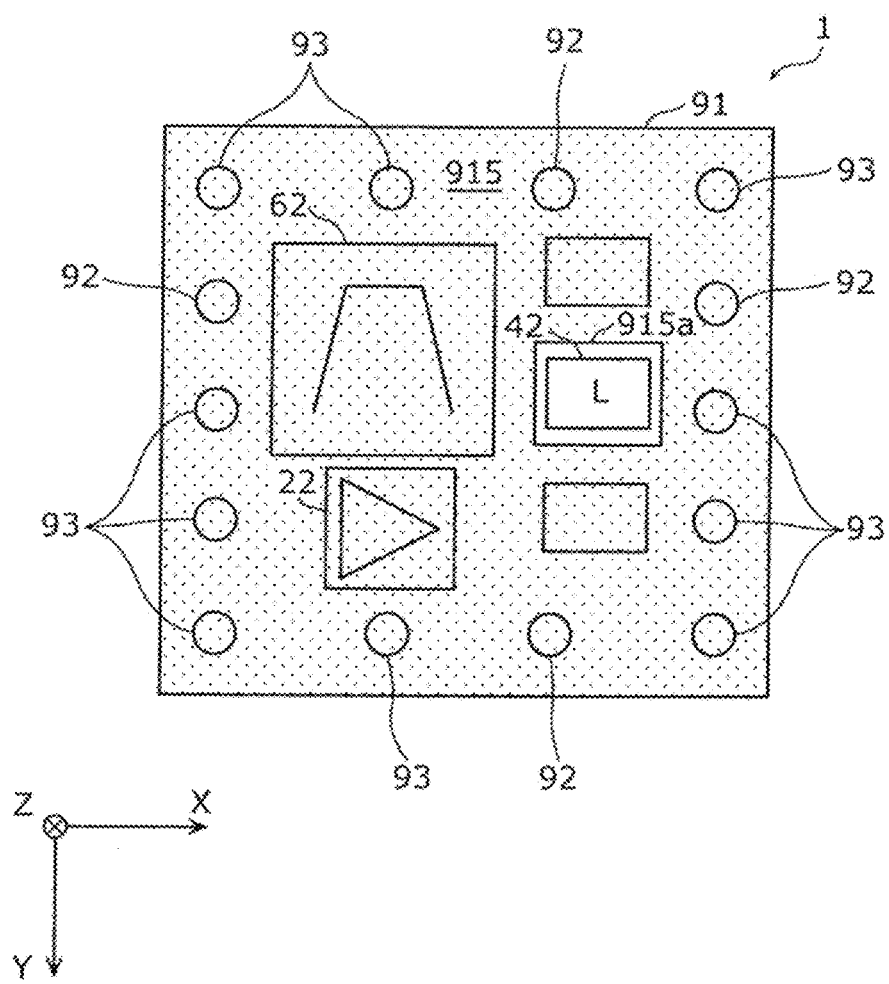
FIG. 5 is a bottom view of a ground electrode layer in the radio-frequency module according to the embodiment.

The planar arrangement of the ground electrode layer 915 will now be specifically described with reference to FIG. 5. FIG. 5 is a bottom view of the ground electrode layer 915 in the radio-frequency module 1 according to the embodiment. The circuit elements and the terminals mounted on the main surface 91b of the mounting substrate 91 are projected on the ground electrode layer 915 having dot patterns added thereto in FIG. 5.

As illustrated in FIG. 5, in a plan view, the ground electrode layer 915 overlaps a footprint of the reception filter 62 and a footprint of the low noise amplifier 22 and does not overlap a footprint of the matching circuit 42. In other words, the reception filter 62 and the low noise amplifier 22 are covered with the ground electrode layer 915 while the matching circuit 42 is not covered with the ground electrode layer 915. The matching circuit 42 is arranged in an area corresponding to a cavity 915a formed in the ground electrode layer 915.

Although the entire footprint of the reception filter 62 and the entire footprint of the low noise amplifier 22 overlap the ground electrode layer 915 in FIG. 5, the overlapping of the footprint of the reception filter 62 and the footprint of the low noise amplifier 22 is not limited to this. For example, part of the footprint of the reception filter 62 and the footprint of the low noise amplifier 22 may overlap with the ground electrode layer 915. In other words, it is sufficient for at least part of the footprint of the reception filter 62 and the footprint of the low noise amplifier 22 to overlap with the ground electrode layer 915 in a plan view of the mounting substrate 91.

[1.4 Advantages]

As described above, according to the embodiment, the radio-frequency module 1 includes the mounting substrate 91 including the ground electrode layer 915 formed by the planar wiring pattern; the multiple ground terminals 93, which are the multiple external connection terminals that are arranged on the main surface 91b of the mounting substrate 91 and that are set to the ground potential; and the first radio-frequency component mounted on the main surface 91b. The multiple ground terminals 93 are arranged at an outer periphery side of the main surface 91b with respect to the first radio-frequency component and are connected to the ground electrode layer 915. In a plan view of the mounting substrate 91, at least part of a footprint of the first radio-frequency component overlaps with the ground electrode layer 915.

With the above configuration, at least part of the first radio-frequency component, which has the multiple ground terminals 93, the multiple external connection terminals, arranged at the outer periphery side and which is mounted on the main surface 91b, is covered with the ground electrode layer 915. Accordingly, the signals radiated from the first radio-frequency component to the mounting substrate 91 side (that is, the up direction) and to the multiple ground terminals 93 side (that is, the side directions) and external noise incident on the first radio-frequency component from the up direction and the side directions are capable of being reduced with the ground electrode layer 915 and the multiple ground terminals 93. In other words, it is possible to improve the shielding effect of the first radio-frequency component. In addition, since the ground electrode layer 915 is connected to the multiple ground terminals 93, it is possible to stabilize the ground potential and to stabilize the shielding effect of the first radio-frequency component.

According to the embodiment, the mounting substrate 91 may have a substantially rectangular shape in a plan view. The multiple ground terminals may be arranged in the four marginal portions 912 along the four sides of the mounting substrate 91. The first radio-frequency component may be arranged in the central portion 913 surrounded by the four marginal portions 912. At least one of the multiple ground terminals 93 may be arranged in each of the four marginal portions 912.

With the above configuration, since at least one of the multiple ground terminals 93 is arranged in each of the four marginal portions 912, it is possible to further improve the shielding effect in the side directions of the first radio-frequency component arranged in the central portion 913.

According to the embodiment, at least one of the multiple ground terminals 93 may be arranged at a position opposed to the first radio-frequency component in a direction perpendicular to the side of the corresponding marginal portion.

With the above configuration, since the ground terminal is capable of being arranged so as to be opposed to the first radio-frequency component, it is possible to further improve the shielding effect in the side directions of the first radio-frequency component.

According to the embodiment, in a plan view of the mounting substrate 91, the entire footprint of the first radio-frequency component may overlap the ground electrode layer 915.

With the above configuration, since the entire first radio-frequency component is capable of being covered with the ground electrode layer 915, it is possible to further improve the shielding effect in the up direction of the first radio-frequency component.

According to the embodiment, the radio-frequency module 1 may further include the second radio-frequency component mounted on the main surface 91a opposite to the main surface 91b of the mounting substrate 91. One of the first radio-frequency component and the second radio-frequency component may include the reception filter 62. The other of the first radio-frequency component and the second radio-frequency component may include the transmission filter 61.

With the above configuration, the transmission filter 61 and the reception filter 62 are capable of being mounted on the different main surfaces of the mounting substrate 91 with the ground electrode layer 915 being sandwiched therebetween. Accordingly, it is possible to improve isolation characteristics between the transmission circuit including the transmission filter 61 and the reception circuit including the reception filter 62.

According to the embodiment, the radio-frequency module 1 may further include the second radio-frequency component mounted on the main surface 91a opposite to the main surface 91b of the mounting substrate 91. One of the first radio-frequency component and the second radio-frequency component may include the low noise amplifier 22. The other of the first radio-frequency component and the second radio-frequency component may include the power amplifier 21.

With the above configuration, the power amplifier 21 and the low noise amplifier 22 are capable of being mounted on the different main surfaces of the mounting substrate 91 with the ground electrode layer 915 being sandwiched therebetween. Accordingly, it is possible to improve the isolation characteristics between the transmission circuit including the power amplifier 21 and the reception circuit including the low noise amplifier 22.

According to the embodiment, the radio-frequency module 1 may further include the second radio-frequency component mounted on the main surface 91a opposite to the main surface 91b of the mounting substrate 91. One of the first radio-frequency component and the second radio-frequency component may include the first matching element (the matching circuit 42) that performs impedance matching between the low noise amplifier 22 and the reception filter 62. The other of the first radio-frequency component and the second radio-frequency component may include the second matching element (the matching circuit 41) that performs impedance matching between the power amplifier 21 and the transmission filter 61.

With the above configuration, the first matching element and the second matching element are capable of being mounted on the different main surfaces of the mounting substrate 91 with the ground electrode layer 915 being sandwiched therebetween. Accordingly, it is possible to improve the isolation characteristics between the transmission circuit including the second matching element and the reception circuit including the first matching element.

According to the embodiment, the first radio-frequency component may include the reception filter 62. The second radio-frequency component may include the transmission filter 61.

With the above configuration, the reception filter 62 is capable of being mounted on the main surface 91b having the multiple ground terminals 93 arranged thereon and the transmission filter 61 is capable of being mounted on the main surface 91a opposite to the main surface 91b. Accordingly, since the reception filter 62 composing the reception circuit more susceptible to the external noise than the transmission circuit is capable of being mounted on the main surface 91b, it is possible to effectively protect the reception circuit from the external noise with the ground electrode layer 915.

According to the embodiment, the first radio-frequency component may further include the low noise amplifier 22.

With the above configuration, the low noise amplifier 22 is capable of being mounted on the main surface 91b different from the main surface 91a on which the transmission filter 61 is mounted. Accordingly, it is possible to further improve the isolation characteristics between the transmission circuit and the reception circuit.

According to the embodiment, the radio-frequency module 1 may further include the first matching element (the matching circuit 42) that performs impedance matching between the low noise amplifier 22 and the reception filter 62. The first matching element may be mounted on the main surface 91b.

With the above configuration, the first matching element, which performs the impedance matching between the low noise amplifier 22 and the reception filter 62, is capable of being mounted on the main surface 91b different from the main surface 91a on which the transmission filter 61 is mounted. Accordingly, it is possible to further improve the isolation characteristics between the transmission circuit and the reception circuit.

According to the embodiment, in a plan view of the mounting substrate 91, a footprint of the first matching element may not overlap the ground electrode layer 915.

With the above configuration, an adverse effect of the ground electrode layer 915 on the first matching element is capable of being suppressed. For example, when the first matching element is an inductor, the influence of the ground electrode layer 915 on the magnetic field distribution of the inductor is capable of being reduced to suppress degradation of the Q value of the inductor. In particular, since the ground electrode layer 915 is formed by the planar wiring pattern, the cavity 915a is capable of being easily formed in the ground electrode layer 915, compared with the shielding electrode layer 95. Accordingly, it is not necessary to ensure the distance in the Z direction between the inductor and the ground electrode layer 915 to lower the profile of the radio-frequency module 1.

According to the embodiment, the second radio-frequency component may further include the power amplifier 21.

With the above configuration, the power amplifier 21 is capable of being mounted on the main surface 91a different from the main surface 91b on which the reception filter 62 is mounted. Accordingly, it is possible to further improve the isolation characteristics between the transmission circuit and the reception circuit.

According to the embodiment, the radio-frequency module 1 may further include the second matching element (the matching circuit 41) that performs impedance matching between the power amplifier 21 and the transmission filter 61. The second matching element may be mounted on the main surface 91a.

With the above configuration, the second matching element, which performs the impedance matching between the power amplifier 21 and the transmission filter 61, is capable of being mounted on the main surface 91a different from the main surface 91b on which the reception filter 62 is mounted. Accordingly, it is possible to suppress leakage of the transmission signal into the low noise amplifier 22 and the RFIC 3 not via the transmission filter 61 and the reception filter 62 because of electromagnetic coupling between the first matching element and the second matching element. Accordingly, it is possible to further improve the isolation characteristics between the transmission circuit and the reception circuit.

According to the embodiment, the radio-frequency module 1 may further include the resin member 941 that is formed on the main surface 91a and that covers at least part of the second radio-frequency component and the shielding electrode layer 95 that covers a surface of the resin member 941 and that is connected to the ground electrode layer 915.

With the above configuration, the signals radiated from the second radio-frequency component to the up direction and the side directions and the external noise incident on the second radio-frequency component from the up direction and the side directions are capable of being reduced with the shielding electrode layer 95. As a result, it is possible to improve the shielding effect of the second radio-frequency component.

According to the embodiment, each of the multiple ground terminals 93 may be a substantially columnar copper electrode.

With the above configuration, the size and the pitch of the multiple ground terminals 93 are capable of being reduced, compared with a case in which the multiple ground terminals 93 are bump electrodes, to improve the density of the multiple ground terminals 93. As a result, it is possible to further improve the shielding effect in the side directions of the first radio-frequency component.

According to the embodiment, the communication apparatus 5 includes the radio-frequency signal processing circuit (the RFIC 3) that processes the radio-frequency signal transmitted and received through the antenna element 2 and the radio-frequency module 1, which transmits the radio-frequency signal between the antenna element 2 and the RFIC 3.

With the above configuration, it is possible to provide the communication apparatus 5 capable of improving the shielding effect of the radio-frequency components mounted on the substrate.

First Modification of Embodiment

A first modification of the above embodiment will now be described. The first modification mainly differs from the above embodiment in the number of the ground terminals arranged on the rear face of the mounting substrate and the arrangement thereof. A radio-frequency module 1A according to the first modification will described below, focusing on points different from the above embodiment. Since the circuit configuration of the radio-frequency module 1A is the same as that of the radio-frequency module 1 according to the above embodiment, a description and illustration of the circuit configuration of the radio-frequency module 1A are omitted herein.

Figure 6:
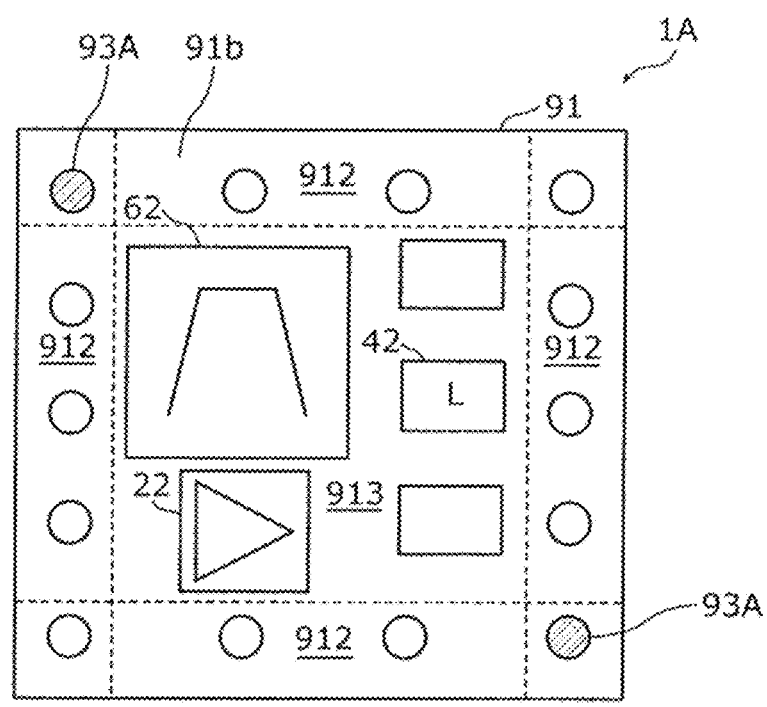
FIG. 6 is a bottom view of a radio-frequency module according to a first modification of the embodiment.
Figure 6:
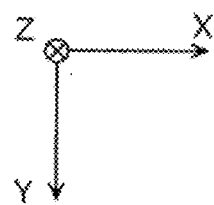

The arrangement configuration of ground terminals 93A in the radio-frequency module 1A will be specifically described with reference to FIG. 6. FIG. 6 is a bottom view of the radio-frequency module 1A according to the first modification of the embodiment. Illustration of the resin member 942 is omitted and the ground terminals 93A are hatched in FIG. 6, as in FIG. 3.

In the first modification, the two ground terminals 93A are arranged on one diagonal line of the mounting substrate 91. In other words, the two ground terminals 93A are arranged in the areas in which the two adjacent marginal portions 912 are overlapped with each other. Even in this case, one of the two ground terminals 93A is arranged in each of the four marginal portions 912.

As described above, according to the first embodiment, one of the two ground terminals 93A is arranged in each of the four marginal portions 912. It is possible to improve the shielding effect on the sides of the reception filter 62 and so on even when the number of the ground terminals 93A is two, compared with a case in which no ground terminal is arranged in the marginal portions 912.

Second Modification of Embodiment

A second modification of the above embodiment will now be described. The second modification mainly differs from the above embodiment in the number of the input-output terminals and the ground terminals arranged on the rear face of the mounting substrate and the arrangement thereof. A radio-frequency module 1B according to the second modification will described below, focusing on points different from the above embodiment. Since the circuit configuration of the radio-frequency module 1B is the same as that of the radio-frequency module 1 according to the above embodiment, a description and illustration of the circuit configuration of the radio-frequency module 1B are omitted herein.

Figure 7:
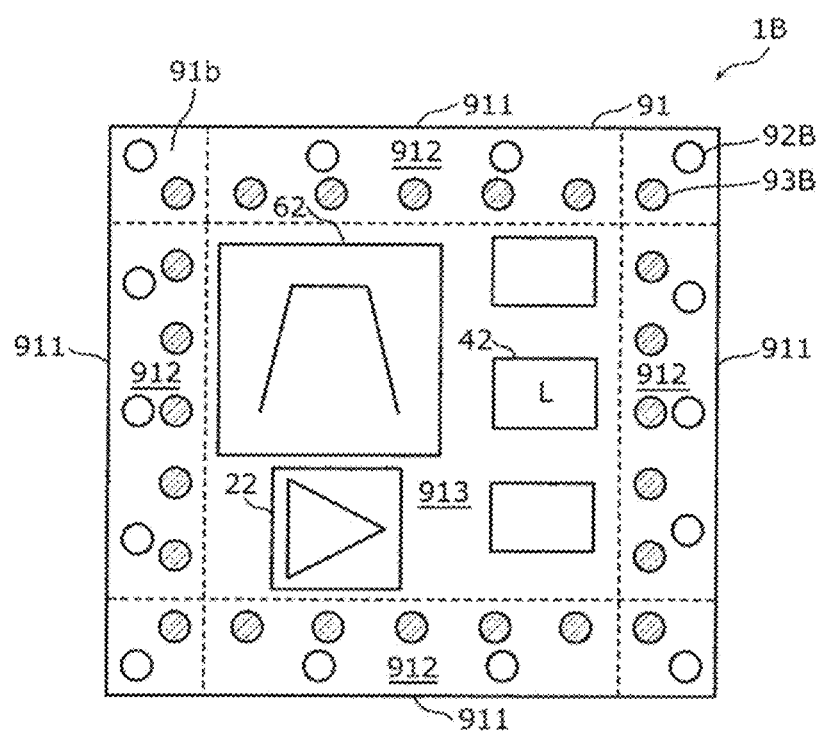
FIG. 7 is a bottom view of a radio-frequency module according to a second modification of the embodiment.

The arrangement configuration of input-output terminals 92B and ground terminals 93B in the radio-frequency module 1B according to the second modification will be specifically described with reference to FIG. 7. FIG. 7 is a bottom view of the radio-frequency module 1B according to the second modification of the embodiment. Illustration of the resin member 942 is omitted and the ground terminals 93B are hatched in FIG. 7, as in FIG. 3. The reference numerals are added to one of the input-output terminals 92B and one of the ground terminals 93B in FIG. 7 and the reference numerals of the remaining terminals are omitted for avoidance of complications.

In the second modification, the input-output terminals 92B and the ground terminals 93B are arranged in two rows in the four marginal portions 912 of the mounting substrate 91. Specifically, the input-output terminals 92B are aligned along the four sides 911 of the mounting substrate 91 and the ground terminals 93B are aligned along the four sides 911 inside the input-output terminals 92B.

As described above, according to the second modification, it is possible to realize the increased number of the input-output terminals and the ground terminals and the arrangement of the many input-output terminals and the many ground terminals.

Third Modification of Embodiment

Although the circuit elements are mounted on both sides of the mounting substrate in the embodiment and the respective modifications, the circuit elements are mounted on only the rear face of the mounting substrate in a third modification. A radio-frequency module 1C according to the third modification will described below, focusing on points different from the above embodiment and the respective modifications. Since the circuit configuration of the radio-frequency module 1C is the same as that of the radio-frequency module 1 according to the above embodiment, a description and illustration of the circuit configuration of the radio-frequency module 1C are omitted herein.

Figure 8:
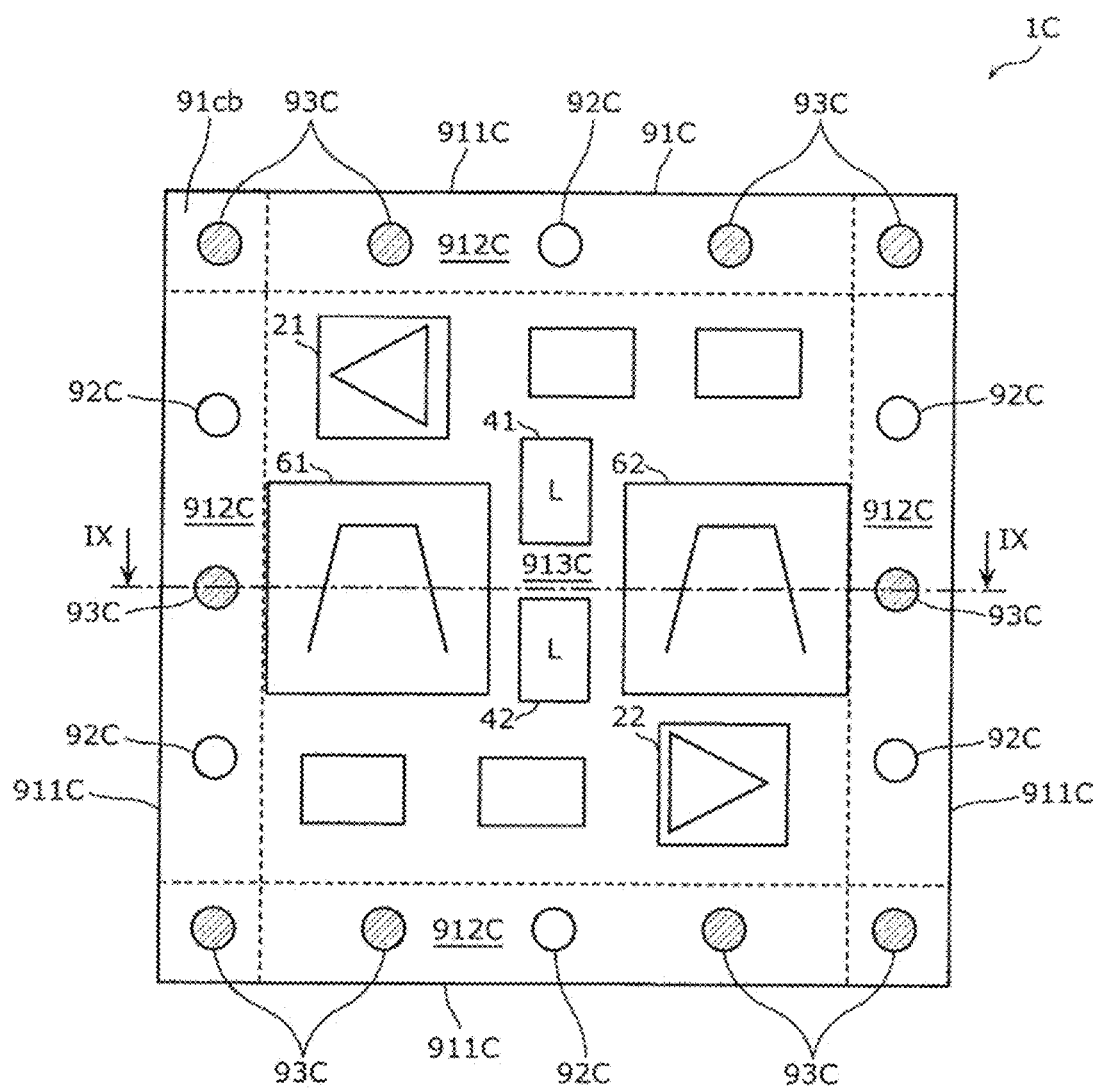
FIG. 8 is a bottom view of a radio-frequency module according to a third modification of the embodiment.
Figure 9:
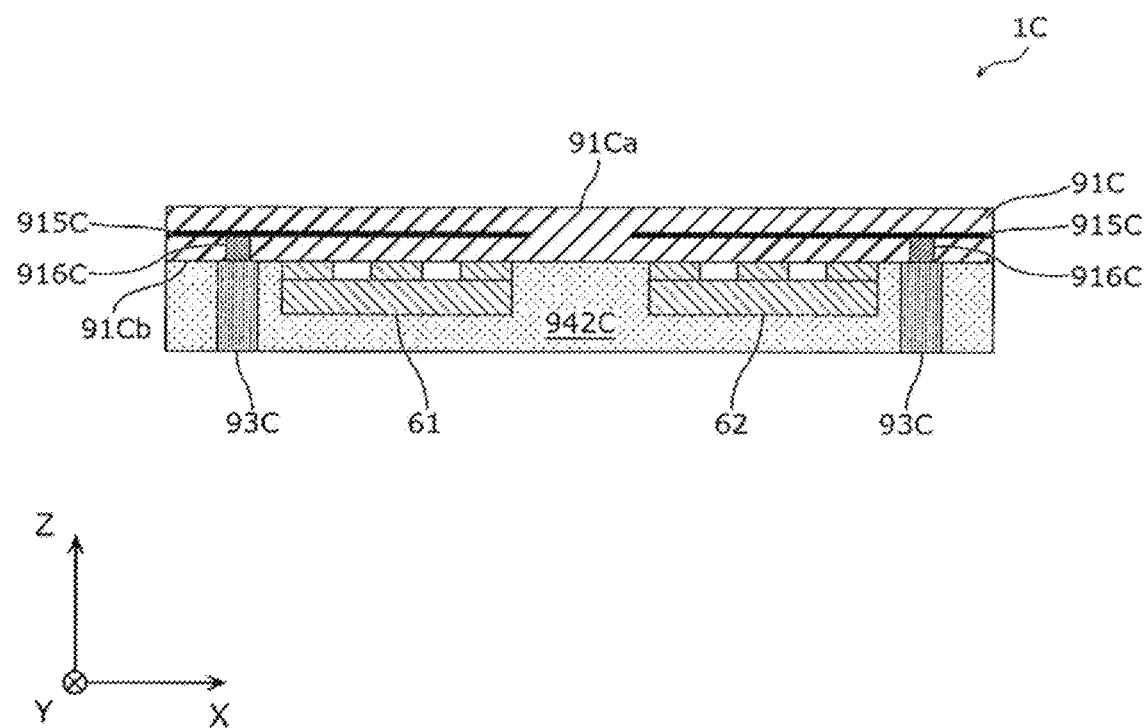
FIG. 9 is a cross-sectional view of the radio-frequency module according to the third modification of the embodiment.

The arrangement configuration of the circuit elements and the terminals in the radio-frequency module 1C according to the third modification will be specifically described with reference to FIG. 8 and FIG. 9. FIG. 8 is a bottom view of the radio-frequency module 1C according to the third modification of the embodiment. FIG. 9 is a cross-sectional view of the radio-frequency module 1C according to the third modification of the embodiment. Specifically, FIG. 9 is a cross-sectional view taken along the IX-IX line in FIG. 8. Illustration of a resin member 942C is omitted and ground terminals 93C are hatched in FIG. 8, as in FIG. 3.

The radio-frequency module 1C according to the third modification includes a mounting substrate 91C, input-output terminals 92C, the ground terminals 93C, the resin member 942C, and other circuit elements (with no reference numerals), in addition to the circuit elements illustrated in FIG. 1.

Although the mounting substrate 91C is a printed circuit board or the like having a substantially rectangular shape in a plan view, like the mounting substrate 91 according to the above embodiment, the mounting substrate 91C is not limited to this. The mounting substrate 91C has main surfaces 91Ca and 91Cb that are opposed to each other. The main surface 91Ca may be called a surface or a top face. The main surface 91Cb is an example of the first main surface and may be called a rear face or a bottom face. In the third modification, no circuit element is mounted on the main surface 91Ca and both the transmission circuit and the reception circuit are mounted on the main surface 91Cb. Specifically, the transmission filter 61, the power amplifier 21, the matching circuit 41, the reception filter 62, the low noise amplifier 22, and the matching circuit 42 are mounted on the main surface 91Cb.

The mounting substrate 91C includes a ground electrode layer 915C formed by a planar wiring pattern, as illustrated in FIG. 9. In a plan view, the ground electrode layer 915C overlaps a footprint of the transmission filter 61, a footprint of the power amplifier 21, a footprint of the reception filter 62, and a footprint of the low noise amplifier 22 and does not overlap footprints of the matching circuits 41 and 42.

The resin member 942C is formed on the main surface 91Cb, and the transmission filter 61, the power amplifier 21, the matching circuit 41, the reception filter 62, the low noise amplifier 22, and the matching circuit 42 are covered with the resin member 942C. The resin member 942C has a function to ensure the reliabilities, such as the mechanical strength and the moisture resistance, of the respective circuit elements. The resin member 942C may not cover all the faces of the transmission filter 61, the power amplifier 21, the matching circuit 41, the reception filter 62, the matching circuit 42, and the low noise amplifier 22. For example, the resin member 942C may cover only the side faces of the power amplifier 21 and the low noise amplifier 22.

Each of the input-output terminals 92C is a terminal for transmitting and receiving electrical signals to and from the external substrate. Each of the input-output terminals 92C is a substantially columnar copper electrode extending in the Z direction from the main surface 91Cb of the mounting substrate 91C and passes through the resin member 942C to connect the mounting substrate 91C to the external substrate.

Each of the ground terminals 93C is an example of the external connection terminal that is arranged on the main surface 91Cb of the mounting substrate 91C and that is set to the ground potential. Each of the ground terminals 93C is a substantially columnar copper electrode extending in the Z direction from the main surface 91Cb of the mounting substrate 91C and passes through the resin member 942C to connect the mounting substrate 91C to the external substrate. Each of the ground terminals 93C is connected to the ground electrode layer 915C via a via conductor 916C.

As illustrated in FIG. 8, the input-output terminals 92C and the ground terminals 93C are arranged in four marginal portions 912C along four sides 911C of the mounting substrate 91C. The transmission filter 61, the power amplifier 21, the matching circuit 41, the reception filter 62, the low noise amplifier 22, and the matching circuit 42 are arranged in a central portion 913C surrounded by the four marginal portions 912C. Referring to FIG. 8, each of the four marginal portions 912C is a substantially rectangular long area extending in the X direction or the Y direction, which is surrounded by broken lines, on the main surface 91Cb.

The input-output terminals 92C and the ground terminals 93C according to the third modification may not necessarily have substantially columnar shapes and may not be made of copper. The shapes and the materials of the input-output terminals 92C and the ground terminals 93C are not restricted. For example, the input-output terminals 92C and the ground terminals 93C may be substantially hemispherical electrodes (bumps) and, for example, may be solder balls or copper core balls.

As described above, according to the third modification, since both the transmission circuit and the reception circuit are mounted on the main surface 91Cb of the mounting substrate 91C, no circuit element may be mounted on the main surface 91Ca. Accordingly, the radio-frequency module 1C may not include the shielding electrode layer and the number of the components is decreased in this case. In addition, since it is possible to omit the process of forming the shielding electrode layer in manufacturing of the radio-frequency module 1C, the radio-frequency module 1C is capable of realizing a reduction of the number of manufacturing steps.

(Other Modifications and so on)

Although the radio-frequency modules and the communication apparatuses according to the above embodiment and the modifications of the embodiment of the present disclosure are described above, the radio-frequency modules and the communication apparatuses according to the present disclosure are not limited to the above embodiment and the modifications. Other embodiments realized by combining arbitrary components in the above embodiment and the modifications, exemplary modifications realized by making various modifications supposed by the person skilled in the art to the above embodiment and the modifications without departing from the scope of the present disclosure, and various devices including the radio-frequency modules and the communication apparatuses are also included in the present disclosure.

For example, in the radio-frequency module and the communication apparatus according to the above embodiment, other circuit elements, lines, and so on may be provided between the paths connecting the respective circuit elements to the signal paths disclosed in the drawings. For example, a switch may be arranged on the path connecting the common terminal 31 to the transmission filter 61 and the reception filter 62. In this case, the switch may be a multi-connection-type switch that switches between connection and non-connection between the antenna element 2 and the transmission filter 61 and switches between connection and non-connection between the antenna element 2 and the reception filter 62. In addition, matching elements may be connected to the path connecting the switch to the transmission filter 61 and the path connecting the switch to the reception filter 62.

Although the ground electrode layer is not overlapped with the matching circuits in a plan view in the above embodiment and the modifications, the ground electrode layer is not limited to this. For example, when characteristics necessary for the matching circuits are ensured, the ground electrode layer may be overlapped with part or all of the matching circuits in a plan view. In other words, the matching circuits may be included in the first radio-frequency component or the second radio-frequency component.

Although the radio-frequency module includes both the transmission circuit and the reception circuit in each of the above embodiment and the modifications, the radio-frequency module may include only one of the transmission circuit and the reception circuit. In this case, one of the transmission circuit and the reception circuit may be mounted on only the rear face of the mounting substrate or may be mounted on both faces of the mounting substrate.

Although the radio-frequency module includes the two filters in each of the above embodiment and the modifications, the radio-frequency module may include three or more filters. For example, the radio-frequency module may support carrier aggregation and may include multiple transmission filters and multiple reception filters.

The present disclosure is widely applicable to a communication device, such as a mobile phone, as the radio-frequency module arranged in a front-end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
a mounting substrate including a ground electrode layer formed by a planar wiring pattern;
a plurality of external connection terminals set to ground potential and arranged on a first main surface of the mounting substrate;
a first radio-frequency component that includes a reception filter and a low noise amplifier and is mounted on the first main surface, wherein the plurality of external connection terminals are connected to the ground electrode layer and are arranged at an outer periphery of the first main surface with respect to the first radio-frequency component;
a second radio-frequency component that includes a transmission filter and is mounted on a second main surface opposite to the first main surface of the mounting substrate; and
a first matching element that is mounted on the first main surface and performs impedance matching between the low noise amplifier and the reception filter; wherein
in a plan view of the mounting substrate, at least part of a footprint of the first radio-frequency component overlaps the ground electrode layer, and
in a plan view of the mounting substrate, a footprint of the first matching element does not overlap the ground electrode layer.

2. The radio-frequency module of claim 1, wherein
the mounting substrate has a rectangular shape in a plan view, and
the plurality of external connection terminals are arranged in four marginal portions along four sides of the mounting substrate.

3. The radio-frequency module of claim 2, wherein
the first radio-frequency component is arranged in a central portion surrounded by the four marginal portions, and
at least one external connection terminal is arranged in each of the four marginal portions.

4. The radio-frequency module of claim 3, wherein
at least one external connection terminal is arranged at a position opposed to the first radio-frequency component in a direction perpendicular to a side of the corresponding marginal portion.

5. The radio-frequency module of claim 1, wherein
in a plan view of the mounting substrate, an entirety of a footprint of the first radio-frequency overlaps with the ground electrode layer.

6. The radio-frequency module of claim 1, wherein
the second radio-frequency component further includes a power amplifier.

7. The radio-frequency module of claim 6, further comprising:
a second matching element that performs impedance matching between the power amplifier and the transmission filter, wherein
the second matching element is mounted on the second main surface.

8. The radio-frequency module of claim 1, further comprising:
a resin member that is formed on the second main surface and that covers at least part of the second radio-frequency component; and
a shielding electrode layer that covers a surface of the resin member and that is connected to the ground electrode layer.

9. The radio-frequency module of claim 1, wherein
each external connection terminal is a columnar copper electrode.

10. A radio-frequency module comprising:
a mounting substrate including a ground electrode layer;
a plurality of external connection terminals set to ground potential, wherein the plurality of external connection terminals are connected to the ground electrode layer and are arranged on a first main surface of the mounting substrate; and
a matching circuit mounted on the first main surface; and
a first radio-frequency component mounted on the first main surface, wherein
in a plan view of the mounting substrate, at least part of a footprint of the first radio-frequency component overlaps the ground electrode layer, and
in the plan view of the mounting substrate, a footprint of the matching circuit does not overlap with the ground electrode layer.

11. A radio-frequency module comprising:
a mounting substrate including a ground electrode layer;
a plurality of external connection terminals set to ground potential, wherein the plurality of external connection terminals are connected to the ground electrode layer and are arranged on a first main surface of the mounting substrate;
a matching circuit mounted on the first main surface;
a cavity formed in the ground electrode layer; and
a first radio-frequency component mounted on the first main surface, wherein
in a plan view of the mounting substrate, at least part of the first radio-frequency component overlaps the ground electrode layer, and
in the plan view of the mounting substrate, at least part of the matching circuit overlaps the cavity formed in the ground electrode layer.

12. The radio-frequency module of claim 11, wherein
the first radio-frequency component includes a reception filter and a low noise amplifier, and
the matching circuit performs impedance matching between the low noise amplifier and the reception filter.

13. The radio-frequency module of claim 11, wherein
the mounting substrate has a rectangular shape in a plan view, and
the plurality of external connection terminals are arranged in four marginal portions along four sides of the mounting substrate.

14. The radio-frequency module of claim 13, wherein
the first radio-frequency component is arranged in a central portion surrounded by the four marginal portions, and
at least one external connection terminal is arranged in each of the four marginal portions.

15. The radio-frequency module of claim 14, wherein
at least one external connection terminal is arranged at a position opposed to the first radio-frequency component in a direction perpendicular to a side of the corresponding marginal portion.

16. The radio-frequency module of claim 11, wherein
in a plan view of the mounting substrate, an entirety of the first radio-frequency overlaps with the ground electrode layer.

17. The radio-frequency module of claim 11, wherein each external connection terminal is a columnar copper electrode.

\* \* \* \* \*